(12) United States Patent
Gaide et al.

(10) Patent No.: US 11,239,203 B2
(45) Date of Patent: Feb. 1, 2022

(54) MULTI-CHIP STACKED DEVICES

(71) Applicant: XILINX, INC., San Jose, CA (US)

(72) Inventors: Brian C. Gaide, Erie, CO (US); Steven P. Young, Boulder, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/672,077

(22) Filed: Nov. 1, 2019

(65) Prior Publication Data

US 2021/0134760 A1  May 6, 2021

(51) Int. Cl.
*H01L 25/065* (2006.01)
*H01L 21/78* (2006.01)
*H01L 23/00* (2006.01)
*H01L 25/00* (2006.01)

(52) U.S. Cl.
CPC .......... *H01L 25/0657* (2013.01); *H01L 21/78* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2225/06565* (2013.01)

(58) Field of Classification Search
CPC ..... H01L 25/0657; H01L 25/50; H01L 21/78; H01L 24/80; H01L 24/08; H01L 2225/06524; H01L 2224/08145; H01L 2225/06565; H01L 2224/80895; H01L 2224/80896
USPC ........................................................ 257/777
See application file for complete search history.

(56) References Cited

U.S. PATENT DOCUMENTS

| | | | |
|---|---|---|---|
| 7,698,470 B2 | 4/2010 | Ruckerbauer et al. | |
| 7,834,440 B2 | 11/2010 | Ito et al. | |
| 8,736,068 B2 | 5/2014 | Bartley et al. | |
| 10,510,629 B2 * | 12/2019 | Chen | H01L 23/28 |
| 2007/0111386 A1 | 5/2007 | Kim et al. | |
| 2007/0128827 A1 | 6/2007 | Faris | |
| 2014/0326856 A1 | 11/2014 | Massetti | |
| 2015/0121052 A1 | 4/2015 | Emma et al. | |
| 2017/0330862 A1 | 11/2017 | Choe et al. | |
| 2017/0338206 A1 * | 11/2017 | Seo | H01L 25/0657 |
| 2019/0123023 A1 | 4/2019 | Teig et al. | |

(Continued)

FOREIGN PATENT DOCUMENTS

| | | |
|---|---|---|
| DE | 102018116729 B3 | 8/2019 |
| EP | 2672511 A1 | 12/2013 |
| EP | 2096350 A1 | 11/2016 |

*Primary Examiner* — Vu A Vu
(74) *Attorney, Agent, or Firm* — Patterson + Sheridan, LLP

(57) ABSTRACT

Examples described herein generally related to multi-chip devices having vertically stacked chips. In an example, a multi-chip device includes a chip stack. The chip stack includes a base chip and a plurality of interchangeable chips. The base chip is directly bonded to a first one of the plurality of interchangeable chips. Each neighboring pair of the plurality of interchangeable chips is directly bonded together in an orientation with a front side of one chip of the respective neighboring pair directly bonded to a backside of the other chip of the respective neighboring pair. Each of the interchangeable chips has a same processing integrated circuit and a same hardware layout. The chip stack can include a distal chip, which can be directly bonded to a second one of the plurality of interchangeable chips.

17 Claims, 7 Drawing Sheets

(56) References Cited

U.S. PATENT DOCUMENTS

2019/0287932 A1 9/2019 Hu et al.
2020/0321315 A1* 10/2020 Yu ........................ H01L 23/481

* cited by examiner

MULTI-CHIP STACKED DEVICES

TECHNICAL FIELD

Examples of the present disclosure generally relate to multi-chip stacked devices containing stacked chips.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require high temperature processing whereas parts of another chip cannot withstand high temperature processing.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

SUMMARY

Examples described herein generally relate to multi-chip devices having vertically stacked chips. Among other benefits, many different types of multi-chip devices can be fabricated using a relatively small number of types of chips.

An example described herein is a multi-chip device. The multi-chip device includes a chip stack. The chip stack includes a base chip and a plurality of interchangeable chips. The base chip is directly bonded to a first one of the plurality of interchangeable chips. Each neighboring pair of the plurality of interchangeable chips is directly bonded together in an orientation with a front side of one chip of the respective neighboring pair directly bonded to a backside of the other chip of the respective neighboring pair. Each of the interchangeable chips has a same processing integrated circuit and a same hardware layout. The chip stack can include a distal chip, which can be directly bonded to a second one of the plurality of interchangeable chips.

Another example described herein is a method of forming different multi-chip devices. Front side processing for a first base chip on a first wafer is performed. Front side processing for a second base chip on a second wafer is performed. The first base chip has a different hardware architecture from the second base chip. Front side processing for a first active chip on each of third wafers is performed. Each of the first active chips of the third wafers has a same processing integrated circuit having a same hardware architecture. A first multi-chip device is formed. Forming the first multi-chip device includes bonding the first wafer to a first one of the third wafers. The first base chip is directly bonded and electrically connected to the first active chip of the first one of the third wafers. A second multi-chip device different from the first multi-chip device is formed. Forming the second multi-chip device includes bonding the second wafer to a second one of the third wafers. The second base chip is directly bonded and electrically connected to the first active chip of the second one of the third wafers.

Another example described herein is a method for forming a multi-chip device. Front side processing for a first chip on a first wafer is performed. Front side processing for respective second chips on second wafers is performed. A front side of the first wafer is bonded to a front side of a first one of the second wafers. Backside processing on the first one of the second wafers is performed after bonding the first wafer to the first one of the second wafers. A backside of the first one of the second wafers is bonded to a front side of a second one of the second wafers. Backside processing on the second one of the second wafers is performed after bonding the first one of the second wafers to the second one of the second wafers. A bonded structure is singulated. The bonded structure includes the first wafer, the first one of the second wafers, and the second one of the second wafers. The bonded structure is singulated into the multi-chip device including the first chip and a plurality of the second chips. Each of the second chips has a same processing integrated circuit having a same hardware architecture.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
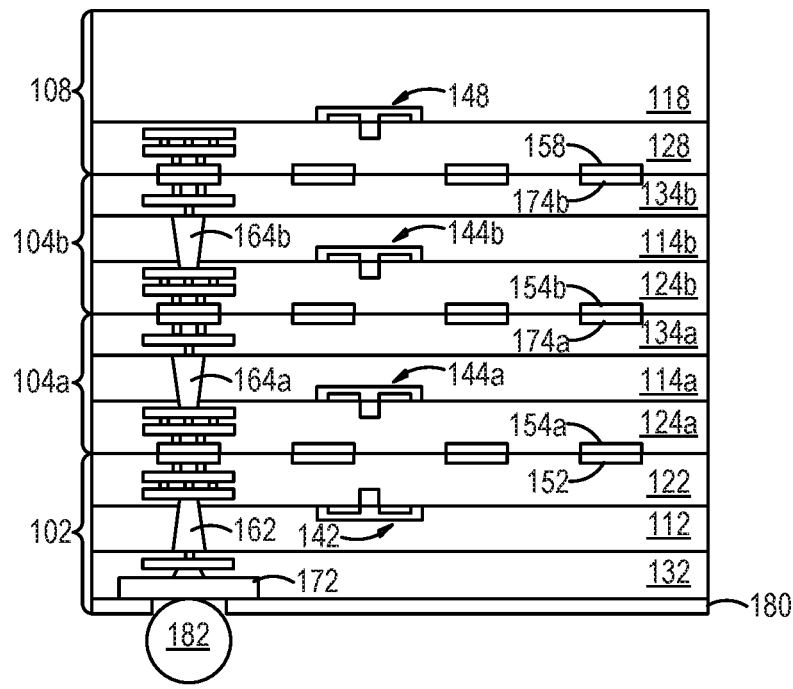
FIG. 1 is a structure of a multi-chip device according to some examples.

Examples described herein generally relate to multi-chip devices having vertically stacked chips. In such a device, neighboring chips can be bonded to each other (e.g., by hybrid bonding). A chip stack of a multi-chip device can include a base chip, one or more interchangeable chips, and, in some examples, a distal chip. If multiple interchangeable chips are implemented, neighboring interchangeable chips are bonded together front side to backside. A base chip is bonded to one of the interchangeable chip(s) by the front side of the base chip being bonded to a front side or a backside of the respective interchangeable chip. If implemented, a distal chip is bonded to one of the interchangeable chip(s) by the front side of the distal chip being bonded to a front side or a backside of the respective interchangeable chip. Each of the interchangeable chip(s) can have a same integrated circuit (IC) and a same hardware layout (e.g., a same chip-to-chip interface and/or arrangement of bond pads). The IC of the interchangeable chip(s) can be a processing IC. The distal circuit can have a different IC from the interchangeable chip(s). The IC of the distal chip can also be a processing IC. The base chip can include an IC for input/output of signal to another circuit outside of the multi-chip device. The IC of the base chip can further include an inter-chip interconnect for connecting chip-to-chip interfaces that may not naturally align. For example, an inter-chip interconnect can route signals in any horizontal direction (e.g., any direction generally perpendicular to the vertical stacking of the chips) within the chip stack of the multi-chip device.

Some examples provide arrangements of interfaces for bonding and a method of stacking that allows for combining different types of chips into many unique types of multi-chip devices. Some examples can minimize changes to the chips to accomplish different combinations to realize the different types of multi-chip devices. This can enable many different types of multi-chip devices to be constructed from a relatively small set of types of chips, which can reduce research and development costs (such as labor, tape-outs, etc.) and can increase time to market.

In some examples, the interchangeable chips can each contain a highly distributed chip-to-chip interface (e.g., arrangement of bond pads on the interchangeable chip), and different chips can be connected to different subsets of the chip-to-chip interface. The chip-to-chip interfaces of the interchangeable chips can be the same so that when the interchangeable chips are bonded together, the interfaces align. Further, the chip-to-chip interface permits functional interchangeability. For example, if different ICs of different base chips connect to different bond pads of a same IC of interchangeable chips, the functionality of the interchangeable chips can be logically unchanged. In some examples, the interchangeable chips are or include programmable logic ICs (e.g., fabric of a field programmable gate array (FPGA)).

In some examples, the base chip can include a chip-to-chip interface that can be concentrated wherever convenient. Multiple base chips with different feature sets can exist, with chip-to-chip interfaces in different locations. Any one of the base chips can connect to an interchangeable chip. Each base chip can use its metallization layer(s) to connect the chip-to-chip interface of the base chip to the chip-to-chip interface of the interchangeable chip. The different base chips can connect to different subsets of chip-to-chip interfaces of the interchangeable chips when different base chips are implemented. Since each base chip can have a unique upper metal connectivity, no changes to the interchangeable chip may be required for the interchangeable chip to pair with different base chips. In some examples, a base chip design may be substantially reused by changing upper metal layers of the base chip design to align connections between the base chip and an interchangeable chip. This can permit different types of multi-chip devices to be fabricated and can be substantially cheaper than taping out an entire second base chip.

In some examples, one or both of the base chip and the distal chip are bonded to the interchangeable chips with respective front sides bonded to a respective interchangeable chip. Bonding in such a manner can enable the outermost chip(s) to use upper metal layers of the respective chip(s) to jog to reach the chip-to-chip interfaces of the respective interchangeable chip. Without such a bonding scheme, an interchangeable chip may have to use metal layers of that chip to jog to reach outer bond pads of the chip-to-chip interface, which may preclude the chip-to-chip interface of interchangeable chips from being able to align and interface with each other. The interchangeable chips are generally bonded using front side to backside bonding, which can preserve the alignment of chip-to-chip interfaces. Preserving this alignment can prevent additional floorplanning constraints that could force alignment in a flipped orientation (e.g., mirroring).

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Concepts described herein can be extended to chips of a multi-chip device having any IC. As used herein, "processing integrated circuit" or "processing IC" refers to an IC comprising a circuit capable of, configured to, and/or configurable to process or manipulate data, as opposed to memory that merely stores data and any circuit ancillary to memory (e.g., a memory controller, an address decoder, etc.). A processing IC may include memory in addition to a circuit capable of, configured to, and/or configurable to process or manipulate data. Examples of processing ICs include ICs including a programmable logic region (e.g., FPGA), a processor (e.g., a central processing unit (CPU), graphics processing unit (GPU), etc.), an application specific integrated circuit (ASIC), the like, or a combination thereof.

Figure 2:
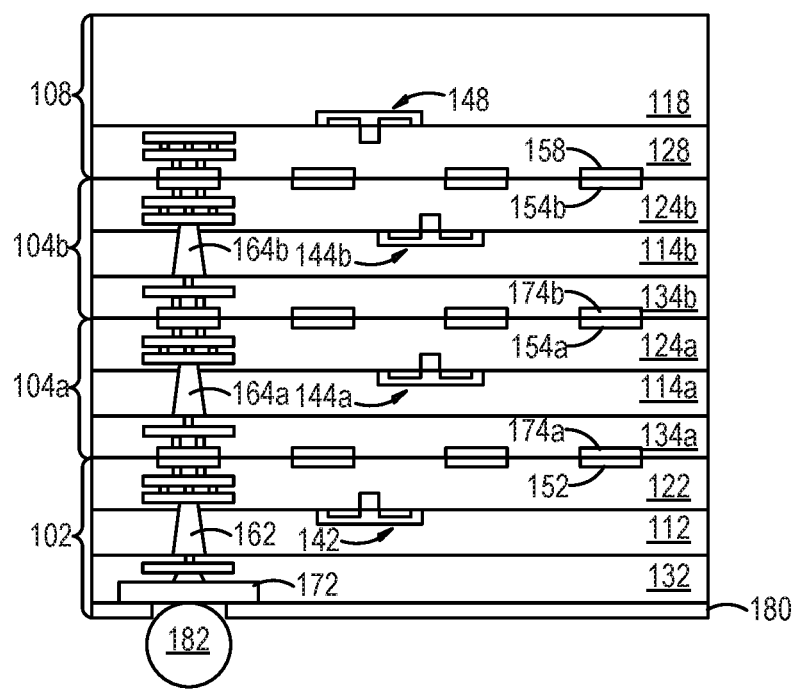
FIG. 2 is a structure of a multi-chip device according to some examples.

FIGS. 1 and 2 are respective structures of multi-chip devices according to some examples. Each of the multi-chip devices of FIGS. 1 and 2 includes a chip stack that includes a base chip 102, interchangeable chips 104a, 104b (collectively or individually, interchangeable chip(s) 104), and a distal chip 108. In the multi-chip device of FIG. 1, the interchangeable chips 104 are arranged active or front side facing down towards the base chip 102, and in the multi-chip device of FIG. 2, the interchangeable chips are arranged active or front side facing up away from the base chip 102. Various other multi-chip devices can have different structures, different number of chips, additional components, etc.

Referring to FIGS. 1 and 2, generally, the chips 102, 104a, 104b, 108 are stacked and form a chip stack in the multi-chip device. The chips 102, 104a, 104b, 108 are stacked to form, in some examples, an Active die-on-Active die (AoA) device. In some examples, such as described below, more or fewer chips can be included in the chip stack. For example, one or more of the interchangeable chips 104 can be removed from or added into a chip stack.

Each of the chips 102, 104a, 104b, 108 includes a respective semiconductor substrate 112, 114a, 114b, 118 and respective front side dielectric layer(s) 122, 124a, 124b, 128 on a front side of the respective semiconductor substrate 112, 114a, 114b, 118. The front side dielectric layer(s) 122, 124a, 124b, 128 include metallization (e.g., metal lines and/or vias) (illustrated but not specifically numbered) formed therein which can electrically connect various components in an IC. Each of the chips 102, 104a, 104b includes backside dielectric layer(s) 132, 134a, 134b on a backside of the respective semiconductor substrate 112, 114a, 114b. The backside dielectric layer(s) 132, 134a, 134b include metallization (e.g., metal lines and/or vias) (illustrated but not specifically numbered) formed therein which can electrically connect various components in an IC. Each semiconductor substrate 112, 114a, 114b, 118 of the chips 102, 104a, 104b, 108 includes, e.g., a transistor 142, 144a, 144b, 148 formed on and/or in the front side surface of the respective semiconductor substrate 112, 114a, 114b, 118. The transistor 142, 144a, 144b, 148 and any other components can be connected to the metallization in the front side dielectric layer(s) 122, 124a, 124b, 128. Each semiconductor substrate 112, 114a, 114b of the respective chip 102, 104a, 104b has backside through-substrate via(s) (TSV(s)) 162, 164a, 164b therethrough, which can electrically connect the metallization in the front side dielectric layer(s) 122, 124a, 124b to the metallization in the backside dielectric layer(s) 132, 134a, 134b of the respective chip 102, 104a, 104b.

Front side bond pads 152, 154a, 154b, 158 (e.g., metal (e.g., Cu) bond pads) are formed in the respective front side dielectric layer(s) 122, 124a, 124b, 128 of the chips 102, 104a, 104b, 108 at an exterior surface distal from the respective semiconductor substrate 112, 114a, 114b, 118. The front side bond pads 152, 154a, 154b, 158 can be in an arrangement that forms a respective chip-to-chip interface. The front side bond pads 152, 154a, 154b, 158 are connected to the metallization in the respective front side dielectric layer(s) 122, 124a, 124b, 128. Backside bond pads 174a, 174b (e.g., metal (e.g., Cu) bond pads) are formed in the respective backside dielectric layer(s) 134a, 134b of the chips 104a, 104b at an exterior surface distal from the respective semiconductor substrate 114a, 114b. The backside bond pads 174a, 174b can be in an arrangement that forms a respective chip-to-chip interface. The backside bond pads 174a, 174b are connected to the metallization in the respective backside dielectric layer(s) 134a, 134b.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102, 104a, 104b, 108 are bonded (e.g., by hybrid bonding using metal-to-metal and oxide-to-oxide bonding) together to form a chip stack. Referring to FIG. 1, the base chip 102 is bonded to the interchangeable chip 104a front side to front side such that the front side bond pads 152 and exterior surface of the front side dielectric layer(s) 122 of the base chip 102 are bonded to the front side bond pads 154a and exterior surface of the front side dielectric layer(s) 124a of the interchangeable chip 104a. The interchangeable chip 104a is bonded to the interchangeable chip 104b backside to front side such that the backside bond pads 174a and exterior surface of the backside dielectric layer(s) 134a of the interchangeable chip 104a are bonded to the front side bond pads 154b and exterior surface of the front side dielectric layer(s) 124b of the interchangeable chip 104b. The interchangeable chip 104b is bonded to the distal chip 108 backside to front side such that the backside bond pads 174b and exterior surface of the backside dielectric layer(s) 134b of the interchangeable chip 104b are bonded to the front side bond pads 158 and exterior surface of the front side dielectric layer(s) 128 of the distal chip 108.

Referring to FIG. 2, the base chip 102 is bonded to the interchangeable chip 104a front side to backside such that the front side bond pads 152 and exterior surface of the front side dielectric layer(s) 122 of the base chip 102 are bonded to the backside bond pads 174a and exterior surface of the backside dielectric layer(s) 134a of the interchangeable chip 104a. The interchangeable chip 104a is bonded to the interchangeable chip 104b front side to backside such that the front side bond pads 154a and exterior surface of the front side dielectric layer(s) 124a of the interchangeable chip 104a are bonded to the backside bond pads 174b and exterior surface of the backside dielectric layer(s) 134b of the interchangeable chip 104b. The interchangeable chip 104b is bonded to the distal chip 108 front side to front side such that the front side bond pads 154b and exterior surface of the front side dielectric layer(s) 124b of the interchangeable chip 104b are bonded to the front side bond pads 158 and exterior surface of the front side dielectric layer(s) 128 of the distal chip 108.

Other arrangements of bonding can be implemented. In other examples, the chips 102, 104a, 104b, 108 can be attached together using external connectors (such as minibumps, solder, etc.). In some examples, some of the chips 102, 104a, 104b, 108 can be attached together by external connectors while others of the chips can be bonded together without use of external connectors. Any permutation of bonding and use of external connectors can be implemented.

In some examples, the base chip 102 includes an inter-chip interconnect that is capable of routing or jogging signals generally horizontally (e.g., parallel to the front side surface of the semiconductor substrate 112). The inter-chip interconnect can be electrically and communicatively coupled to the other chips of the chip stack. Signals can be routed, e.g., horizontally in the inter-chip interconnect of the base chip 102 and then vertically (through metallizations and TSVs of various chips) to an appropriate target chip in the chip stack without significant horizontal routing in the target chip. Additionally, the base chip 102 includes appropriate input/output circuits for receiving signals from a source and/or transmitting signals to a destination outside of the chip stack of the multi-chip device. The base chip 102 can further include other circuits. For example, the base chip 102 can be or include a processing IC and may further be a System-on-Chip (SoC). A more detailed example is described below.

In some examples, each of the interchangeable chips 104 includes a processing IC. The processing IC of the interchangeable chips 104 is a same IC. The hardware topology, architecture, and layout of the interchangeable chips 104 are the same between the interchangeable chips 104 in some examples. In some examples, the processing IC of the interchangeable chips 104 includes one or more programmable logic regions (e.g., fabric of a FPGA), which has the same hardware topology, architecture, and layout between the interchangeable chips 104. A more detailed example is described below.

The distal chip 108 can be or include any IC. For example, the distal chip 108 can be or include a processing IC or memory. In some examples, the distal chip 108 is an ASIC. In some examples the distal chip 108 is a same processing IC as the interchangeable chips 104 except without, e.g., TSVs and backside dielectric layer(s) and metallizations therein. Any interchangeable chip 104 or distal chip 108 may generically be referred to as an active chip. A more detailed example is described below.

Figure 3:
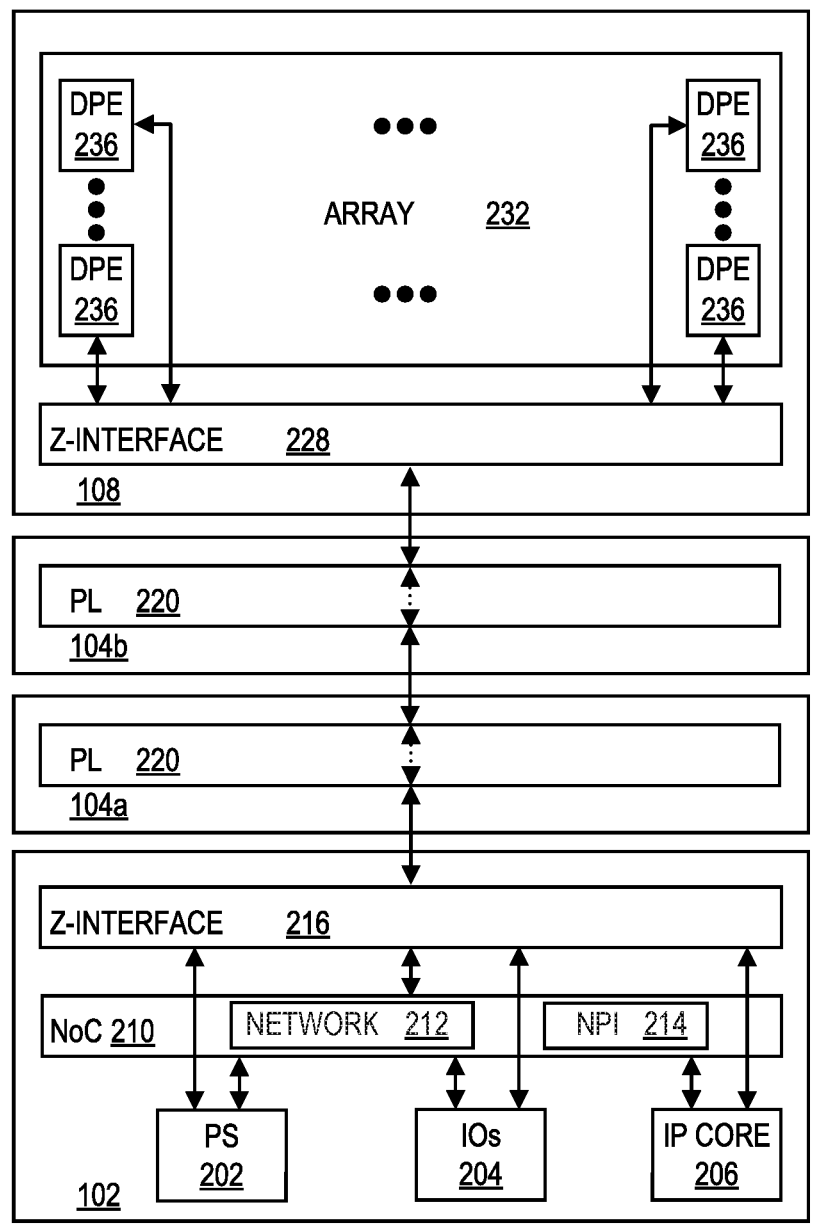
FIG. 3 is a block diagram of a circuit schematic depicting integrated circuits of a chip stack of the multi-chip device of FIG. 1 or 2 according to some examples.

FIG. 3 is a block diagram of a circuit schematic depicting ICs of a chip stack of the multi-chip device of FIG. 1 or 2 according to some examples. In the illustrated example, the multi-chip device is a multi-chip programmable device. The circuit schematic can be implemented in the multi-chip device of FIG. 1 or 2, e.g., regardless of the orientation of the interchangeable chips 104.

In the illustrated example, the base chip 102 includes a base IC on the base chip 102, which may be a SoC. The interchangeable chips 104 each include a programmable logic (PL) IC 220, which is a same IC and has a same hardware layout and topology. The distal chip 108 includes a compute IC. These ICs are provided as an example implementation. Other ICs (e.g., with other hard IP blocks) can be implemented in the chips.

The base IC on the base chip 102 includes a processing system 202, input/output circuits (IOs) 204, IP core circuits 206, a Network-on-Chip (NoC) 210, and a Z-interface 216. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102.

For example, the NPI 214 may be used to program any input/output circuit 204 and/or IP core circuit 206 that is programmable.

The Z-interface 216 can be a passive interconnect or can include active circuits, such as buffers to drive signals. The Z-interface 216 provides an interface, including via metal lines and vias in metallization layers, for the processing system 202, input/output circuits 204, IP core circuits 206, and programmable network 212 of the NoC 210 to chips overlying the base chip 102.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 216 such that data, such as transactional data and configuration data, can be communicated through the Z-interface 216 to another chip. Each of the processing system 202, input/output circuits 204, and IP core circuits 206 is connected to the Z-interface 216 for direct communications with, e.g., programmable logic in the PL ICs 220 in overlying chips 104a, 104b. Other communication mechanisms, such as direct connections, between the various subsystems and circuits may be implemented.

The PL IC 220 on each of the interchangeable chips 104a, 104b includes one or more programmable logic region. The programmable logic region is logic circuitry that may be programmed to perform specified functions. The programmable logic region can include any number or arrangement of programmable tiles. As an example, the programmable logic region may be implemented as fabric of an FPGA. For example, the programmable logic region can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the programmable logic region. Any logic and connections can be implemented by the programmable logic region by programming or configuring any of the programmable tiles of the programmable logic region.

Each PL IC 220 can also include a configuration interconnect that includes a configuration Frame (CFRAME) driver. The CFRAME driver may be or include control logic to communicate configuration data (such as a bitstream) to configure programmable logic. Each programmable logic region is configurable or programmable by configuration data received via the Z-interface 216. For example, the processing system 202 (e.g., a PMC of the processing system 202) can transmit configuration data via the programmable network 212 of the NoC 210 and the Z-interface 216 to a respective PL IC 220. In some examples, a configuration interconnect (e.g., including a CFRAME driver) can direct the configuration data to appropriate programmable tiles and can control configuring such programmable tiles.

The PL ICs 220 or the interchangeable chips 104a, 104b can include communication paths to transmit signals between underlying and overlying chips. For example, the communication paths can be passive communication paths, such as metallizations and TSVs through a given chip. In some examples, active circuitry can be included in a communication path, such as a buffer or driver. In some examples, active circuitry can be programmable to configure, e.g., directionality of communication of signals, such as by tri-state buffers.

The compute IC on the distal chip 108 includes a Z-interface 228 and a data processing engine (DPE) array 232. The DPE array 232 includes DPEs 236 arranged in an array.

The Z-interface 228 can be a passive interconnect or can include active circuits, such as buffers to drive signals. The Z-interface 228 provides an interface, including via metal lines and vias in metallization layers, for each of the DPEs 236 to chips underlying the distal chip 108. Each of the DPEs 236 is connected to the Z-interface 228. Hence, the DPEs 236 can be connected to various systems of other chips via the Z-interface 228. The Z-interface 228 provides an interface between DPEs 236 and other subsystems, such as the PL ICs 220 of the interchangeable chips 104a, 104b and/or the programmable network 212 of the NoC 210.

Each of the DPEs 236 is a hardwired circuit block and may be programmable. Each of the DPEs 236 includes a hardened core and a memory module. The core provides data processing capabilities of the DPE 236. The core may be implemented as any of a variety of different processing circuits. In some examples, the core is implemented as a processor that is capable of executing program instruction code, e.g., computer readable program instruction code. Program memory can be included in the core and can be capable of storing program instruction code that is executed by the core. The memory module includes memory banks. The memory banks are capable of storing data that may be read and consumed by one or more core and data (e.g., results) that may be written by one or more core. The memory module can further include a direct memory access (DMA) engine for direct memory accesses to the memory banks.

Each of the DPEs 236 further includes a streaming switch and a memory mapped switch. The streaming switch is connected to the core and memory module (e.g., a DMA engine in a memory module) of the respective DPE 236. The streaming switch of a DPE 236 is connected to streaming switches in neighboring DPEs 236. The interconnected streaming switches of the DPEs 236 form a streaming network. The memory mapped switch of a DPE 236 is connected to memory mapped switch(es) of neighboring DPE(s) 236 along a given direction. The interconnected memory mapped switches of the DPEs 236 form a memory mapped network. Each of the DPEs 236 can also include configuration registers, which can be programmed to configure the core, memory module (e.g., programmable components therein), streaming switch, or any other programmable component of the respective DPE 236. The memory mapped switch can be coupled to the configuration registers for writing to or programming the configuration registers. In some examples, the streaming network and the memory mapped network can each be implemented as an on-chip interconnect, such as an Advanced Microcontroller Bus Architecture (AMBA) eXtensible Interface (AXI) bus (e.g., or switch) and/or other interconnect circuitry.

In some examples, the DPEs 236 are mapped to the address space of the processing system 202. Accordingly, any configuration registers and/or memories within any DPE 236 may be accessed via the memory mapped network. For example, the program memory, the memory banks, and configuration registers of a DPE 236 may be read and/or written via the memory mapped network (e.g., via the memory mapped switch of the respective DPE 236). Through the memory mapped network, subsystems of the multi-chip device are capable of reading or writing any configuration register, program memory, and memory bank.

DPEs 236 may be programmed by loading configuration data into respective configuration registers that define operations of the DPEs 236 (including cores, memory modules, and streaming switches), by loading program instruction code into program memory for execution by the core of the respective DPEs 236, and/or by loading application data into memory banks of the DPEs 236. The processing system 202 (e.g., a PMC of the processing system 202) can transmit configuration data, program instruction code, and/or application data via the programmable network 212 of the NoC 210 and the Z-interfaces 216, 228 to one or more DPEs 236. The configuration data, program instruction code, and/or application data received from the programmable network 212 is a memory mapped transaction that is routed via the memory mapped network to a configuration register, program memory, and/or memory bank addressed by the memory mapped transaction (and hence, to a target DPE 236). The configuration data, program instruction code, and/or application data is written to the configuration register, program memory, and/or memory bank, respectively, by the memory mapped transaction.

Once the streaming network (e.g., streaming switches) is configured, cores of DPEs 236 can communicate with each other or with other subsystems via the streaming network. A core of a DPE 236 can write or read data to or from a memory module (e.g., a DMA engine) of another DPE 236 by streaming communications via the streaming network. The streaming network can route the streaming communications according to the configuration of various streaming switches as programmed in respective configuration registers.

Cores in neighboring DPEs 236 can further communicate via shared memory communications. A core of a DPE 236 can be directly connected to respective memory modules of neighboring DPEs 236. A core of a DPE 236 can directly write to a memory bank, and a core of a neighboring DPE 236 can directly read from that memory bank, which permits communication between the cores. The memory bank can therefore be shared between the cores of neighboring DPEs 236. An independent cascade stream can also be implemented between cores of DPEs 236.

Figure 4:
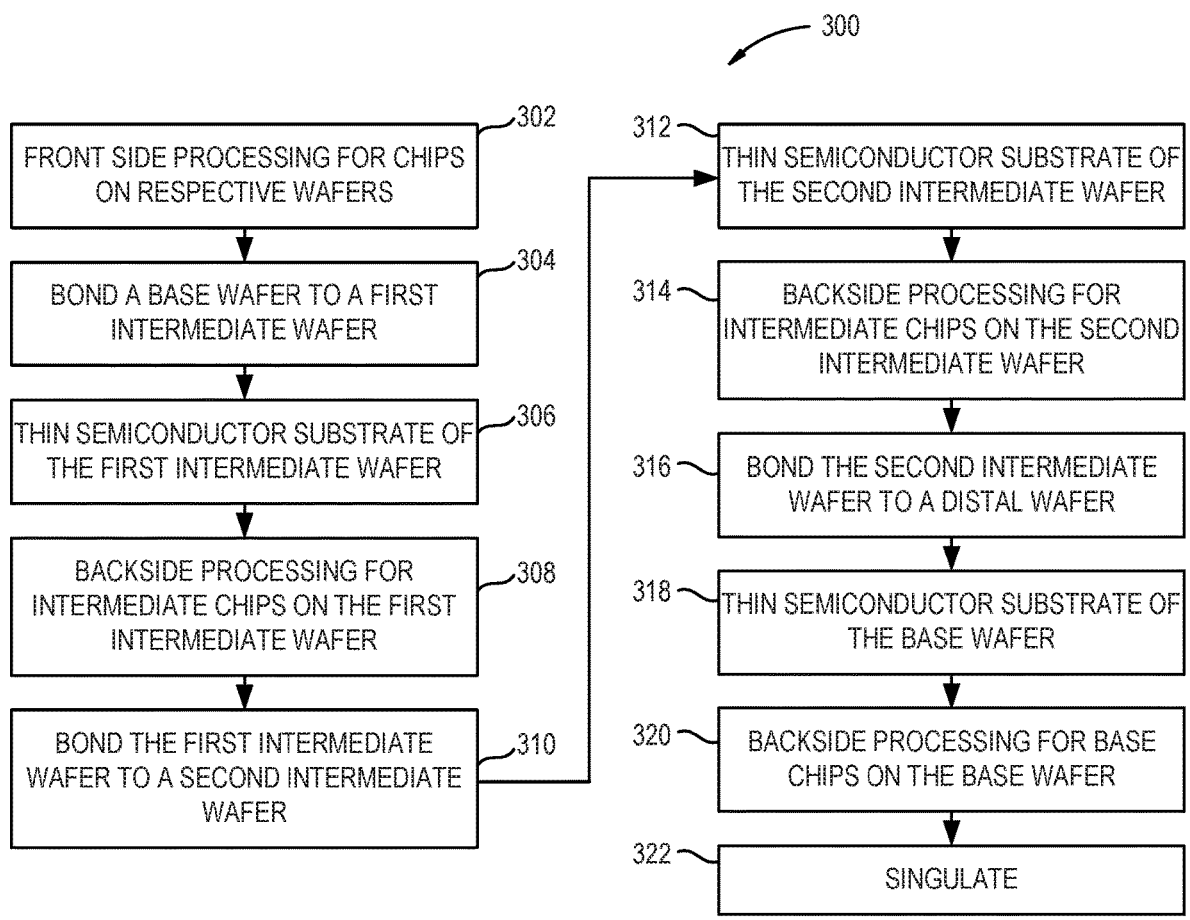
FIG. 4 is a flowchart of a method of forming the multi-chip device of FIG. 1 according to some examples.
Figure 5:
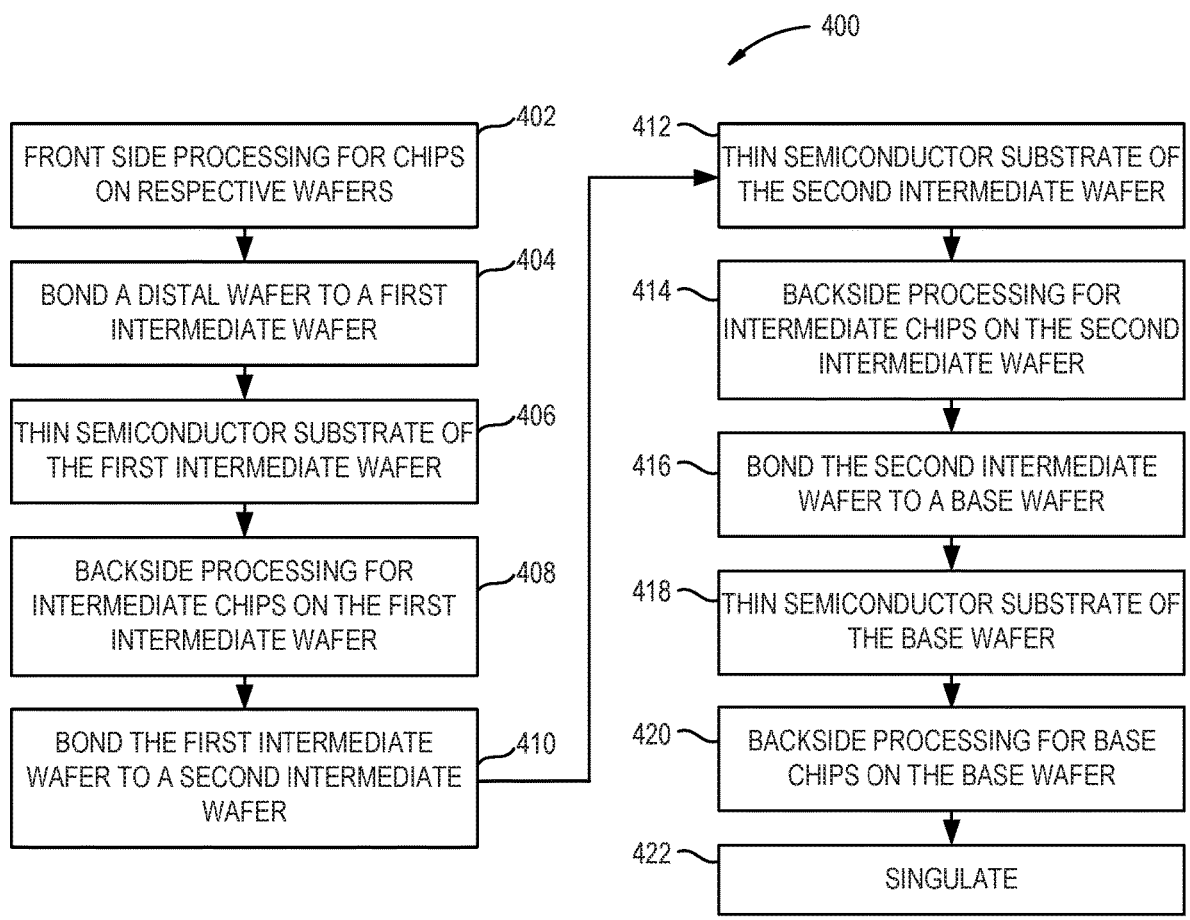
FIG. 5 is a flowchart of a method of forming the multi-chip device of FIG. 2 according to some examples.

FIG. 4 is a flowchart of a method 300 of forming the multi-chip device of FIG. 1 according to some examples, and FIG. 5 is a flowchart of a method 400 of forming the multi-chip device of FIG. 2 according to some examples. The processing of the methods 300, 400 of FIGS. 4 and 5 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer; a wafer on which one or more interchangeable chips 104 are formed is referred to as an interchangeable wafer; and a wafer on which one or more distal chips are formed is referred to as a distal wafer. Any wafer can be any shape and/or size.

Referring to FIG. 4, at block 302, front side processing for chips on the respective wafers is performed. For example, front side processing of each semiconductor substrate 112, 114a, 114b, 118 (e.g., wafer) can include forming devices (e.g., transistors 142, 144a, 144b, 148) in and/or on the front surface of the semiconductor substrate 112, 114a, 114b, 118, and forming front side dielectric layer(s) 122, 124a, 124b, 128 with metallizations and front side bond pads 152, 154a, 154b, 158 on the front surface of the semiconductor substrate 112, 114a, 114b, 118. Multiple base chips 102 can be formed on a base wafer. Multiple interchangeable chips 104 can be formed on a plurality of interchangeable wafers. Multiple distal chips 108 can be formed on a distal wafer.

At block 304, a base wafer is bonded to a first interchangeable wafer, such as front side to front side bonding as shown in FIG. 1. As a result of the bonding, a front side of a base chip 102 is bonded to a front side of an interchangeable chip 104a, as shown in FIG. 1. The bonding can be hybrid bonding, such as bonding front side bond pads 152 on the base wafer to front side bond pads 154a on the first interchangeable wafer, and bonding the exterior surface of the front side dielectric layer(s) 122 on the base wafer to the exterior surface of the front side dielectric layer(s) 124a on the first interchangeable wafer.

At block 306, the semiconductor substrate of the first interchangeable wafer is thinned from a backside of the first interchangeable wafer. As show in FIG. 1, the semiconductor substrate 114a of the interchangeable chip 104a is thinned from the backside. The thinning can be by a chemical mechanical polish (CMP) or other appropriate process. At block 308, backside processing for interchangeable chips on the first interchangeable wafer is performed. As illustrated by FIG. 1, the backside processing can include forming backside TSVs 164a through the semiconductor substrate 114a of the first interchangeable wafer and connecting to metallization in the front side dielectric layer(s) 124a on the first interchangeable wafer. The backside processing can further include forming backside dielectric layer(s) 134a with metallizations and backside bond pads 174a on the backside of the semiconductor substrate 114a. The metallizations in the backside dielectric layer(s) 134a can be connected to the metallizations in the front side dielectric layer(s) 124a through the backside TSVs 164a.

At block 310, the first interchangeable wafer is bonded to a second interchangeable wafer, such as backside to front side bonding as shown in FIG. 1. As a result of the bonding, a backside of an interchangeable chip 104a is bonded to a front side of an interchangeable chip 104b, as shown in FIG. 1. The bonding can be hybrid bonding, such as bonding backside bond pads 174a on the first interchangeable wafer to front side bond pads 154b on the second interchangeable wafer, and bonding the exterior surface of the backside dielectric layer(s) 134a on the first interchangeable wafer to the exterior surface of the front side dielectric layer(s) 124b on the second interchangeable wafer.

At block 312, the semiconductor substrate of the second interchangeable wafer is thinned from a backside of the second interchangeable wafer, like described with respect to block 306. As show in FIG. 1, the semiconductor substrate 114b of the interchangeable chip 104b is thinned from the backside.

At block 314, backside processing for interchangeable chips on the second interchangeable wafer is performed, like described with respect to block 308. As illustrated by FIG.

1, the backside processing can include forming backside TSVs 164*b* through the semiconductor substrate 114*b* of the second interchangeable wafer and connecting to metallization in the front side dielectric layer(s) 124*b* on the second interchangeable wafer. The backside processing can further include forming backside dielectric layer(s) 134*b* with metallizations and backside bond pads 174*b* on the backside of the semiconductor substrate 114*b*. The metallizations in the backside dielectric layer(s) 134*b* can be connected to the metallizations in the front side dielectric layer(s) 124*b* through the backside TSVs 164*b*.

At block 316, the second interchangeable wafer is bonded to a distal wafer, such as backside to front side bonding as shown in FIG. 1. As a result of the bonding, a backside of an interchangeable chip 104*b* is bonded to a front side of a distal chip 108, as shown in FIG. 1. The bonding can be hybrid bonding, such as bonding backside bond pads 174*b* on the second interchangeable wafer to front side bond pads 158 on the distal wafer, and bonding the exterior surface of the backside dielectric layer(s) 134*b* on the second interchangeable wafer to the exterior surface of the front side dielectric layer(s) 128 on the distal wafer.

At block 318, the semiconductor substrate of the base wafer is thinned from a backside of the base wafer, like described with respect to block 306. As show in FIG. 1, the semiconductor substrate 112 of the base chip 102 is thinned from the backside.

At block 320, backside processing for base chips on the base wafer is performed, like described with respect to block 308. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 322, the bonded wafers are singulated (e.g., by sawing) to separate individual multi-chip devices that have been formed. Each of the multi-chip devices can be as shown in FIG. 1.

Referring to FIG. 5, front side and backside processing at various blocks can be the same or similar to processing described above with respect to FIG. 4. Hence, the method 400 is briefly described.

At block 402, front side processing for chips on the respective wafers is performed, like at block 302 above. At block 404, a distal wafer is bonded to a first interchangeable wafer, such as front side to front side bonding as shown in FIG. 2. As a result of the bonding, a front side of a distal chip 108 is bonded to a front side of an interchangeable chip 104*b*, as shown in FIG. 1. The bonding can be hybrid bonding, such as bonding front side bond pads 158 on the distal wafer to front side bond pads 154*b* on the first interchangeable wafer, and bonding the exterior surface of the front side dielectric layer(s) 128 on the distal wafer to the exterior surface of the front side dielectric layer(s) 124*b* on the first interchangeable wafer.

At block 406, the semiconductor substrate of the first interchangeable wafer is thinned from a backside of the first interchangeable wafer. At block 408, backside processing for interchangeable chips on the first interchangeable wafer is performed. At block 410, the first interchangeable wafer is bonded to a second interchangeable wafer, such as backside to front side bonding as shown in FIG. 2. As a result of the bonding, a backside of an interchangeable chip 104*b* is bonded to a front side of an interchangeable chip 104*a*, as shown in FIG. 2. The bonding can be hybrid bonding, such as bonding backside bond pads 174*b* on the first interchangeable wafer to front side bond pads 154*a* on the second interchangeable wafer, and bonding the exterior surface of the backside dielectric layer(s) 134*b* on the first interchangeable wafer to the exterior surface of the front side dielectric layer(s) 124*a* on the second interchangeable wafer.

At block 412, the semiconductor substrate of the second interchangeable wafer is thinned from a backside of the interchangeable wafer. At block 414, backside processing for interchangeable chips on the second interchangeable wafer is performed. At block 416, the second interchangeable wafer is bonded to a base wafer, such as backside to front side bonding as shown in FIG. 2. As a result of the bonding, a backside of an interchangeable chip 104*a* is bonded to a front side of a base chip 102, as shown in FIG. 2. The bonding can be hybrid bonding, such as bonding backside bond pads 174*a* on the second interchangeable wafer to front side bond pads 152 on the base wafer, and bonding the exterior surface of the backside dielectric layer(s) 134*a* on the second interchangeable wafer to the exterior surface of the front side dielectric layer(s) 122 on the base wafer.

At block 418, the semiconductor substrate of the base wafer is thinned from a backside of the base wafer. At block 420, backside processing for base chips on the base wafer is performed. At block 422, the bonded wafers are singulated (e.g., by sawing) to separate individual multi-chip devices that have been formed. Each of the multi-chip devices can be as shown in FIG. 2.

The various operations of blocks of the methods 300, 400 can be repeated and/or omitted to form various multi-chip devices. These methods 300, 400 have been provided as examples of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the methods 300, 400 above. Other example multi-chip devices are also described below.

Figure 6A:
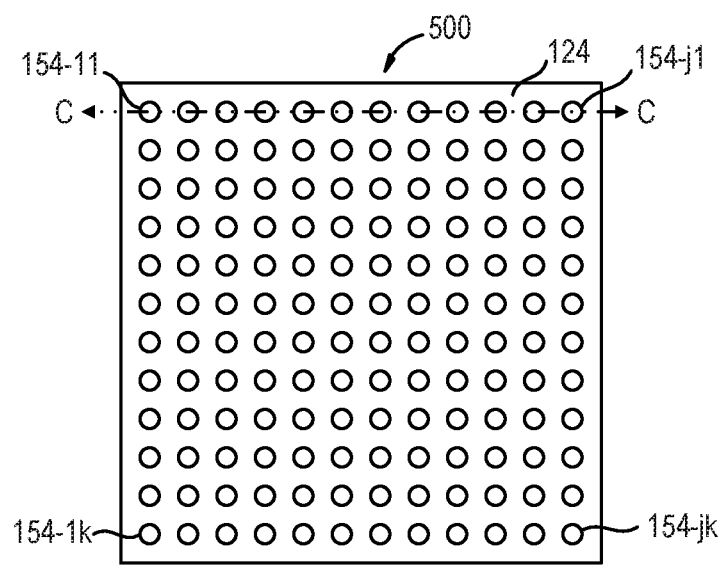
FIGS. 6A, 6B, and 6C depict aspects of bonding pads of interchangeable chips according to some examples.
Figure 6B:
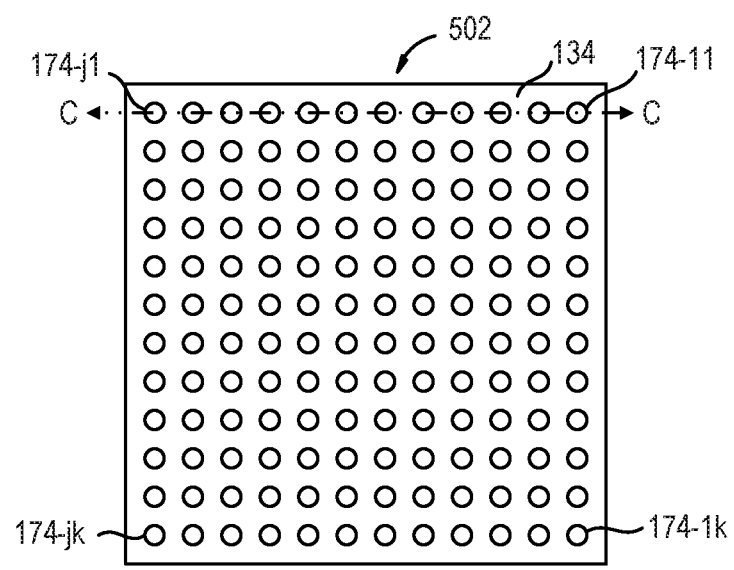
Figure 6C:
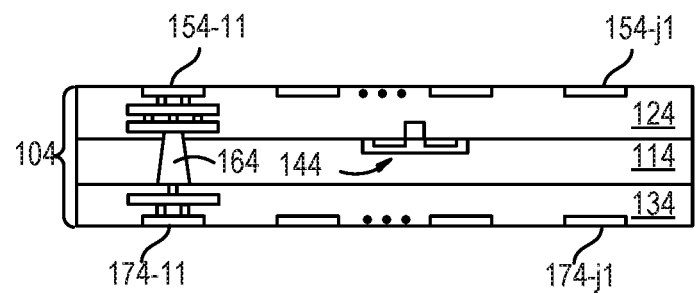

FIGS. 6A, 6B, and 6C illustrate aspects of bond pads 154, 174 of interchangeable chips 104 according to some examples. Front side bond pads 154 are illustrative of front side bond pads 154*a*, 154*b* of FIGS. 1 and 2, and backside bond pads 174 are illustrative of backside bond pads 174*a*, 174*b* of FIGS. 1 and 2. In a front side perspective view 500 of an interchangeable chip 104 shown in FIG. 6A, the front side bond pads 154 are arranged in a j row by k column array, with a position of a front side bond pad 154 being indicated by an array position indicator appended to the reference numeral (e.g., "154-11" indicates a first row and first column position in the array). In a backside perspective view 502 of the interchangeable chip 104 shown in FIG. 6B, the backside bond pads 174 are also arranged in a j row by k column array, with a position of a backside bond pad 174 being indicated by an array position indicator appended to the reference numeral (e.g., "174-11" indicates a first row and first column position in the array). The differing perspective views 500, 502 of FIGS. 6A and 6B show arrays that are mirrored due to the different perspectives; however, the arrays match or correspond as shown by FIG. 6C.

FIG. 6C illustrates a cross-sectional view of the interchangeable chip 104 along a C-C cross-section identified in FIGS. 6A and 6B. As shown in FIG. 6C, a front side bond pad 154-11 is vertically aligned with a backside bond pad 174-11, and a front side bond pad 154-j1 is vertically aligned with a backside bond pad 174-j1. Each front side bond pad 154 is vertically aligned with a corresponding backside bond pad 174. A number and/or arrangement of front side bond pads 154 and backside bond pads 174 can vary, e.g., as long as each front side bond pad 154 is vertically aligned with a corresponding backside bond pad 174 on the interchangeable chip, in some examples.

Having interchangeable chips 104 with vertically aligned front side bond pads 154 and backside bond pads 174, such as illustrated in FIGS. 6A-6C, can permit any number of interchangeable chips 104 to be stacked and bonded in a multi-chip device. As shown in FIGS. 1 and 2, interchangeable chips 104a, 104b are bonded backside to front side. With the backside bond pads 174 replicating the arrangement of the front side bond pads 154 on each interchangeable chip 104, the interface at which a subsequent interchangeable chip 104 is bonded is continuously replicated and aligned with backside to front side bonding. This permits any number of interchangeable chips 104 to be bonded and included in a chip stack.

Different base chips can be included in different chip stacks to realize different multi-chip devices. For example, assuming the same interchangeable chips 104a, 104b and distal chip 108 are used in different multi-chip devices, the different multi-chip devices can be realized using different base chips 102. In some examples, the different base chips 102 have different ICs that provide different resources and/or different functionality. For example, in the context of the base IC shown in FIG. 3, the processing system 202, input/output circuits 204, and/or IP core circuits 206 can differ between the different base ICs to provide different resources and/or functionality.

In some examples, for different multi-chip devices, various base chips 102 can have an arrangement of front side bond pads 152 that matches the arrangement of front side bond pads 154a (for a multi-chip device as in FIG. 1) or backside bond pads 174a (for a multi-chip device as in FIG. 2). In such examples, each of the front side bond pads 152 is bonded and directly electrically connected to a bond pad 154a or 174a, and each of the bond pads 154a or 174a (depending on the orientation of the interchangeable chip 104a) is bonded and directly electrically connected to a front side bond pad 152. In such examples, the base chip 102 can provide access to each and every resource on the interchangeable chips 104a, 104b and distal chip 108.

In some examples, for different multi-chip devices, various base chips 102 can have an arrangement of front side bond pads 152 that is different from the arrangement of front side bond pads 154a or backside bond pads 174a (depending on the orientation of the interchangeable chip 104a).

Figure 7:
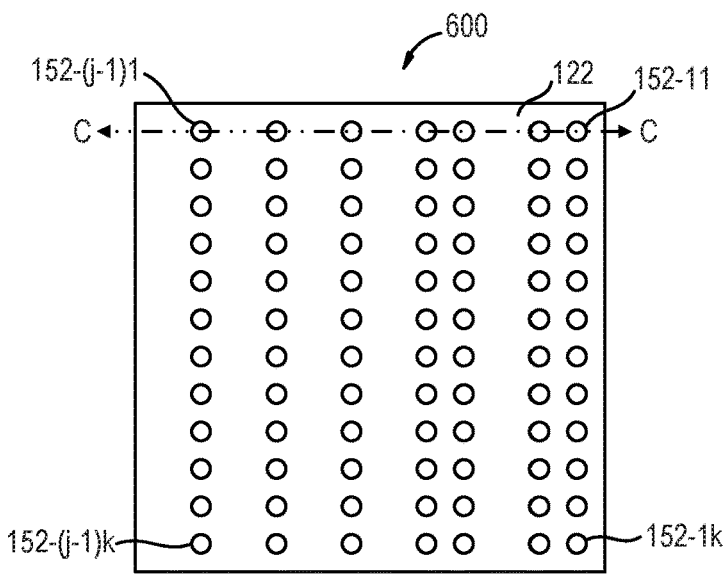
FIG. 7 is a front side perspective view of a first base chip showing an arrangement of front side bond pads of the first base chip according to some examples.
Figure 8:
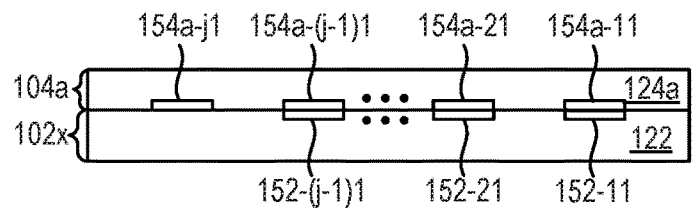
FIG. 8 depicts, in part, front side bond pads of a first base chip bonded to a subset of front side bond pads of an interchangeable chip according to some examples.

FIG. 7 is a front side perspective view 600 of a first base chip 102x showing an arrangement of front side bond pads 152 of the first base chip 102x. A position of a front side bond pad 152 is indicated by a position indicator appended to the reference numeral (e.g., "152-11" indicates a first row and first column position), which can correspond to a position of a bond pad 154a or 174a of the interchangeable chip 104a to which the first base chip 102x is bonded. The arrangement of front side bond pads 152 in FIG. 7 differs from the array of front side bond pads 154 in FIG. 6A. As an example, the arrangement in FIG. 7 omits a j-column of front side bond pads. FIG. 8 shows, in part, the front side bond pads 152 of the first base chip 102x bonded to a subset of the front side bond pads 154a of the interchangeable chip 104a. A subset of the front side bond pads 154a (e.g., 154a-11, 154a-21, 154a-(j−1)1) of the interchangeable chip 104a is bonded to and directly electrically connected to respective front side bond pads 152 (e.g., 152-11, 152-21, 152-(j−1)1) of the first base chip 102x. A subset of the front side bond pads 154a (e.g., 154a-j1) of the interchangeable chip 104a is not bonded to and not directly electrically connected to a front side bond pad of the first base chip 102x, and contact the exterior surface of the front side dielectric layer(s) 122 of the first base chip 102x. Each of the front side bond pads 152 of the first base chip 102x is bonded to and directly electrically connected to a front side bond pad 154a of the interchangeable chip 104a, although in some examples, some front side bond pads 152 may not be bonded to and not directly electrically connected to a bond pad of the interchangeable chip 104a.

In some examples, dummy or loop-back bond pads can be included in the arrangement of front side bond pads 152 where bond pads would not otherwise be present at respective locations corresponding to front side bond pads 154a. The dummy or loop-back pads may be electrically isolated and separate from the IC of the base chip. The loop-back pads may be connected to another loop-back bond pad or any other bond pad to loop any signals back to the interchangeable chip 104a and/or to prevent any front side bond pad 154a from being electrically floating. In such examples, each of the front side bond pads 154a of the interchangeable chip 104a is bonded to and directly electrically connected to a respective front side bond pads 152 (e.g., including any dummy or loop-back bond pad) of the first base chip 102x.

Figure 9:
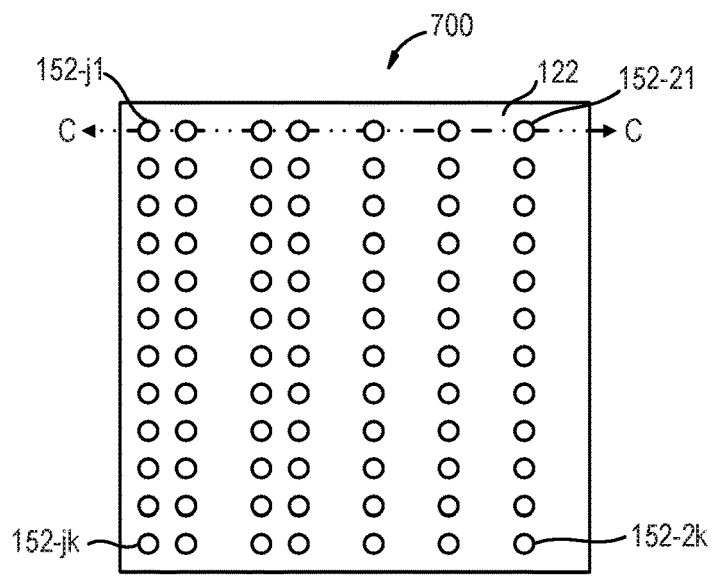
FIG. 9 is a front side perspective view of a second base chip showing an arrangement of front side bond pads of the second base chip according to some examples.
Figure 10:
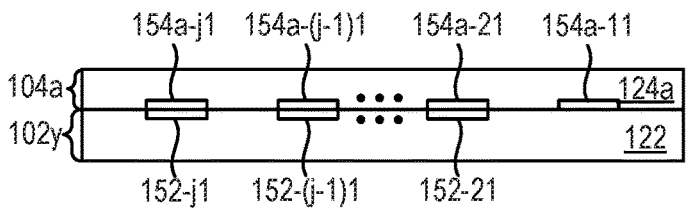
FIG. 10 depicts, in part, front side bond pads of a second base chip bonded to a subset of front side bond pads of an interchangeable chip according to some examples.

FIG. 9 is a front side perspective view 700 of a second base chip 102y showing an arrangement of front side bond pads 152 of the second base chip 102y. The second base chip 102y differs from the first base chip 102x, and as illustrated, the arrangement of front side bond pads 152 of the second base chip 102y in FIG. 9 differs from the arrangement of front side bond pads 152 of the first base chip 102x in FIG. 7. Referring to FIG. 9, a position of a front side bond pad 152 is indicated by a position indicator appended to the reference numeral (e.g., "152-11" indicates a first row and first column position), which can correspond to a position of a bond pad 154a or 174a of the interchangeable chip 104a to which the second base chip 102y is bonded. The arrangement of front side bond pads 152 in FIG. 9 differs from the array of front side bond pads 154 in FIG. 6A. As an example, the arrangement in FIG. 9 omits a 1-column of front side bond pads. FIG. 10 shows, in part, the front side bond pads 152 of the second base chip 102y bonded to a subset of the front side bond pads 154a of the interchangeable chip 104a. A subset of the front side bond pads 154a (e.g., 154a-21, 154a-(j−1)1, 154a-j1) of the interchangeable chip 104a is bonded to and directly electrically connected to respective front side bond pads 152 (e.g., 152-21, 152-(j−1)1, 152-j1) of the second base chip 102y. A subset of the front side bond pads 154a (e.g., 154a-11) of the interchangeable chip 104a is not bonded to and not directly electrically connected to a front side bond pad of the second base chip 102y, and contact the exterior surface of the front side dielectric layer(s) 122 of the second base chip 102y. Each of the front side bond pads 152 of the second base chip 102y is bonded to and directly electrically connected to a front side bond pad 154a of the interchangeable chip 104a, although in some examples, some front side bond pads 152 may not be bonded to and not directly electrically connected to a bond pad of the interchangeable chip 104a. In some examples, dummy or loop back bond pads can be included in the arrangement of front side bond pads 152 and bonded to front side bond pads 154a as described above.

The foregoing description of FIGS. 7-10 is in the context of front side to front side bonding between the base chip 102x, 102y and the interchangeable chip 104a like shown in FIG. 1. A person having ordinary skill in the art will readily understand the above description in the context of front side to backside bonding between the base chip 102x, 102y and the interchangeable chip 104a like shown in FIG. 2.

The different base chips 102x, 102y can provide or prohibit access to different resources in the interchangeable chips 104a, 104b and distal chip 108. For example, a resource connected or coupled to a front side bond pad 154a (or backside bond pad 174a depending on orientation) of the interchangeable chip 104a that is not bonded to and not directly electrically connected to a front side bond pad of the base chip 102x, 102y that is electrically connected to the IC of the base chip 102x, 102y can be masked and unused in the multi-chip device. Since different front side bond pads 154a (or backside bond pads 174a depending on orientation) of the interchangeable chip 104a are bonded to and directly electrically connected to front side bond pads 152 of the base chips 102x, 102y that are electrically connected to the IC of the base chip 102x, 102y, different resources may be accessible in the respective multi-chip devices.

In some examples, the different base chips 102x, 102y can be realized by utilizing different lithography masks for forming one or more upper metallizations in the front side dielectric layer(s) 122 of the respective base chips 102x, 102y. The different lithography masks can cause different metallization layouts, which can result in the different arrangements of front side bond pads 152, on the different base chips 102x, 102y. In some examples, lower metallization layers and devices formed on the semiconductor substrate can be the same in the different base chips 102x, 102y.

According to some examples, a large number of different types of multi-chip devices can be formed using a relatively small number of types of chips. FIGS. 11 through 20 illustrate different multi-chip devices that are generally formed from different combinations of a first base chip 102x, a second base chip 102y, any number of interchangeable chips 104, and a distal chip 108. Each of the multi-chip devices of FIGS. 11 through 20 includes four or less chips. Other examples can implement more chips.

In the examples of FIGS. 11 through 20, front side processing for chips on respective wafers is performed. Multiple first base chips 102x can be formed on multiple first base wafers. Multiple second base chips 102y can be formed on multiple second base wafers. Multiple interchangeable chips 104 can be formed on multiple interchangeable wafers. Multiple distal chips 108 can be formed on multiple distal wafers. Any multi-chip device in FIGS. 11 through 20 can be formed from the first base wafers, second base wafers, interchangeable wafers, and distal wafers. Each multi-chip device can be formed by generally implementing various operations of FIG. 4 or 5, as a person having ordinary skill in the art will readily understand. Processing for each multi-chip device is briefly described in the context of FIG. 4.

In some example multi-chip devices, an interchangeable chip 104 is in a distal position from the base chip 102. In these examples, description of an interchangeable chip 104 that is in a distal position is to illustrate that a chip that undergoes the same front side processing on an interchangeable wafer as any other interchangeable wafer is implemented in that distal position. This is in contrast to a distal chip 108 which may have different front side processing on a distal wafer than the front side processing on an interchangeable wafer. Backside processing on an interchangeable chip 104 that is in a distal position may be omitted. Any interchangeable chip 104 or distal chip 108 may generically be referred to as an active chip.

Figure 11:
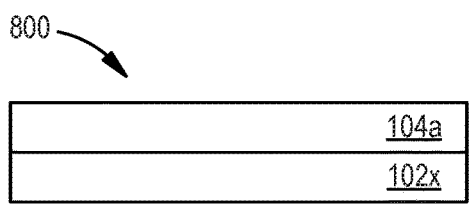
FIGS. 11 through 20 depict different multi-chip devices that are generally formed from different combinations of a first base chip, a second base chip, any number of interchangeable chips, and a distal chip according to some examples.

FIG. 11 illustrates a multi-chip device 800 that has a first base chip 102x bonded to an interchangeable chip 104a. A first base wafer can be bonded to an interchangeable wafer, like at block 304. Then, the semiconductor substrate of the first base wafer can be thinned, like at block 318. Backside processing for the first base chips 102x can be performed on the base wafer, like at block 320. The bonded wafers are then singulated, like at block 322. In some examples, backside processing is not performed on the interchangeable wafer for the interchangeable chip 104a.

Figure 12:
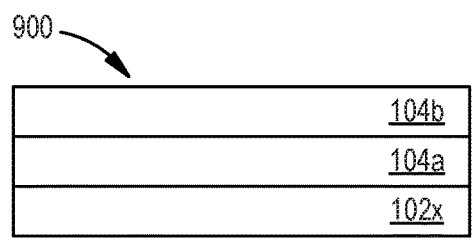

FIG. 12 illustrates a multi-chip device 900 that has a first base chip 102x bonded to an interchangeable chip 104a, which is further bonded to an interchangeable chip 104b. A first base wafer can be bonded to a first one of the interchangeable wafers, like at block 304, and thinning of and backside processing on the first one of the interchangeable wafers is performed, like at blocks 306 and 308. The first one of the interchangeable wafers can be bonded to a second one of the interchangeable wafers, like at block 310. Then, the semiconductor substrate of the first base wafer can be thinned, like at block 318. Backside processing for the first base chips 102x can be performed on the base wafer, like at block 320. The bonded wafers are then singulated, like at block 322. In some examples, backside processing is not performed on the second one of the interchangeable wafers for the interchangeable chip 104b.

Figure 13:
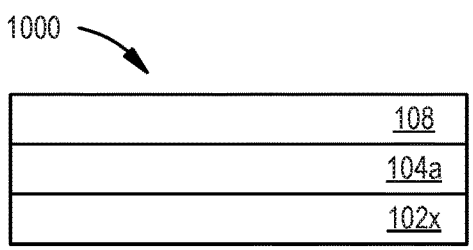

FIG. 13 illustrates a multi-chip device 1000 that has a first base chip 102x bonded to an interchangeable chip 104a, which is further bonded to a distal chip 108. A first base wafer can be bonded to an interchangeable wafer, like at block 304, and thinning of and backside processing on the interchangeable wafer is performed, like at blocks 306 and 308. The interchangeable wafer can be bonded to a distal wafer, similar to block 316. Then, the semiconductor substrate of the first base wafer can be thinned, like at block 318. Backside processing for the first base chips 102x can be performed on the base wafer, like at block 320. The bonded wafers are then singulated, like at block 322.

Figure 14:
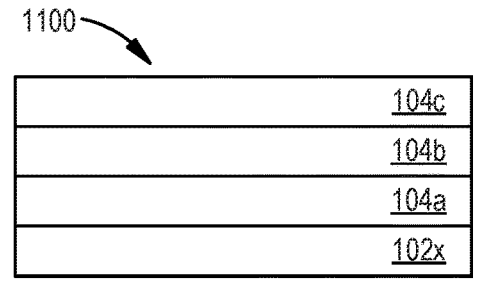

FIG. 14 illustrates a multi-chip device 1100 that has a first base chip 102x, an interchangeable chip 104a, an interchangeable chip 104b, and an interchangeable chip 104c, each bonded to neighboring chip(s). A first base wafer can be bonded to a first one of the interchangeable wafers, like at block 304, and thinning of and backside processing on the first one of the interchangeable wafers is performed, like at blocks 306 and 308. The first one of the interchangeable wafers can be bonded to a second one of the interchangeable wafers, like at block 310, and thinning of and backside processing on the second one of the interchangeable wafers is performed, like at blocks 312 and 314. The second one of the interchangeable wafers can be bonded to a third one of the interchangeable wafers, similar to block 316. Then, the semiconductor substrate of the first base wafer can be thinned, like at block 318. Backside processing for the first base chips 102x can be performed on the base wafer, like at block 320. The bonded wafers are then singulated, like at block 322. In some examples, backside processing is not performed on the third one of the interchangeable wafers for the interchangeable chip 104c.

Figure 15:
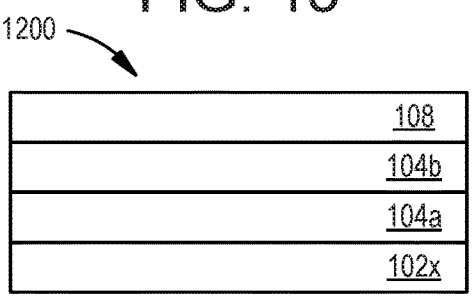

FIG. 15 illustrates a multi-chip device 1200 that has a first base chip 102x, an interchangeable chip 104a, an interchangeable chip 104b, and a distal chip 108, each bonded to neighboring chip(s). The multi-chip device 1200 can be formed as described with respect to FIG. 4 using the first base wafer for the first base chip 102x as the base wafer.

Figure 16:
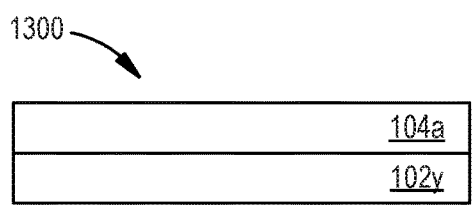

FIG. 16 illustrates a multi-chip device 1300 that has a second base chip 102y bonded to an interchangeable chip 104a. The multi-chip device 1300 can be formed as described above with respect to the multi-chip device 800 of FIG. 11, except using a second base wafer for the second base chip 102y instead of the first base wafer.

Figure 17:
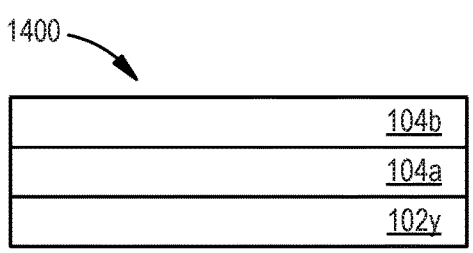

FIG. 17 illustrates a multi-chip device 1400 that has a second base chip 102y bonded to an interchangeable chip 104a, which is further bonded to an interchangeable chip 104b. The multi-chip device 1400 can be formed as described above with respect to the multi-chip device 900 of FIG. 12, except using a second base wafer for the second base chip 102y instead of the first base wafer.

Figure 18:
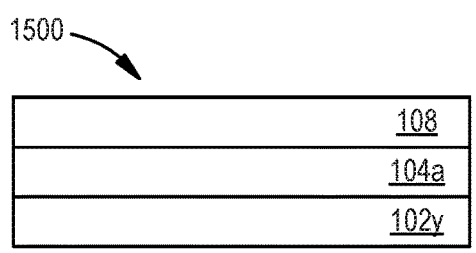

FIG. 18 illustrates a multi-chip device 1500 that has a second base chip 102y bonded to an interchangeable chip 104a, which is further bonded to a distal chip 108. The multi-chip device 1500 can be formed as described above with respect to the multi-chip device 1000 of FIG. 13, except using a second base wafer for the second base chip 102y instead of the first base wafer.

Figure 19:
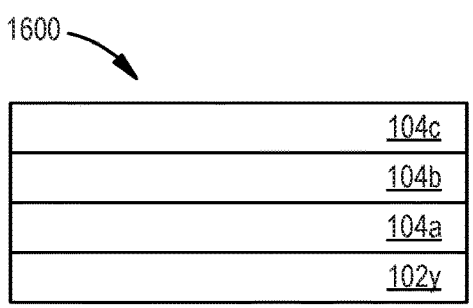

FIG. 19 illustrates a multi-chip device 1600 that has a second base chip 102y, an interchangeable chip 104a, an interchangeable chip 104b, and an interchangeable chip 104c, each bonded to neighboring chip(s). The multi-chip device 1600 can be formed as described above with respect to the multi-chip device 1100 of FIG. 14, except using a second base wafer for the second base chip 102y instead of the first base wafer.

Figure 20:
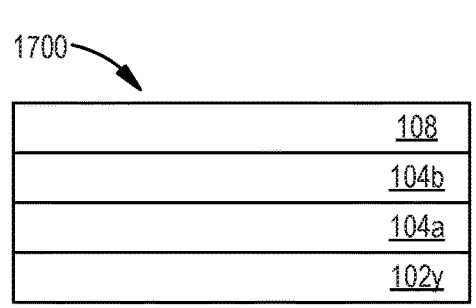

FIG. 20 illustrates a multi-chip device 1700 that has a second base chip 102y, an interchangeable chip 104a, an interchangeable chip 104b, and a distal chip 108, each bonded to neighboring chip(s). The multi-chip device 1700 can be formed as described with respect to FIG. 4 using the second base wafer for the second base chip 102y as the base wafer.

While the foregoing is directed to specific examples, other and further examples may be devised without departing from the basic scope thereof, and the scope thereof is determined by the claims that follow.

What is claimed is:

1. A multi-chip device comprising:
a chip stack comprising:
a base chip having a first plurality of front side bond pads; and
a plurality of interchangeable chips comprising:
a first chip of the plurality of interchangeable chips having a second plurality of front side bond pads, and a first plurality of backside bond pads;
a second chip of the plurality of interchangeable chips having a third plurality of front side bond pads, and a second plurality of backside bond pads, wherein, the base chip being directly bonded to the first chip of the plurality of interchangeable chips, each neighboring pair of the plurality of interchangeable chips being directly bonded together in an orientation with a front side of one chip of the respective neighboring pair directly bonded to a backside of the other chip of the respective neighboring pair, each of the interchangeable chips having a same processing integrated circuit and a same hardware layout, and wherein a first front side bond pad of the first plurality of front side bond pads on the base chip is bonded to a first front side bond pad of the second plurality of front side bond pads on the first chip of the plurality of interchangeable chips, and a third front side bond pad of the third plurality of front side bond pads on the second chip of the plurality of interchangeable chips is bonded to a first backside bond pad of the first plurality of backside bond pads of the first chip of the plurality of interchangeable chips, wherein the plurality of interchangeable chips enable a replacement base chip to bond to the first chip of the plurality of interchangeable chips without changing a functionality of the plurality of interchangeable chips.

2. The multi-chip device of claim 1, wherein the base chip is directly bonded to the first chip of the plurality of interchangeable chips in an orientation with a front side of the base chip directly bonded to a front side of the first chip of the plurality of interchangeable chips.

3. The multi-chip device of claim 1, wherein the chip stack further comprises a distal chip directly bonded to a second chip of the plurality of interchangeable chips.

4. The multi-chip device of claim 1, wherein the chip stack further comprises a distal chip directly bonded to a second chip of the plurality of interchangeable chips in an orientation with a backside of the second chip of the plurality of interchangeable chips directly bonded to a front side of the distal chip.

5. The multi-chip device of claim 1, wherein the processing integrated circuit includes one or more programmable logic regions.

6. The multi-chip device of claim 1, wherein the first chip of the plurality of interchangeable chips includes metal bond pads at a surface directly bonded to the base chip, at least some of the metal bond pads not being electrically connected to an integrated circuit of the base chip.

7. A multi-chip device comprising:
a chip stack comprising:
a base chip having a first plurality of front side bond pads; and
a plurality of interchangeable chips comprising:
a first chip of the plurality of interchangeable chips having a second plurality of front side bond pads, and a first plurality of backside bond pads;
a second chip of the plurality of interchangeable chips having a third plurality of front side bond pads, and a second plurality of backside bond pads, wherein, the base chip being directly bonded to the first chip of the plurality of interchangeable chips, each neighboring pair of the plurality of interchangeable chips being directly bonded together in an orientation with a front side of one chip of the respective neighboring pair directly bonded to a backside of the other chip of the respective neighboring pair, each of the interchangeable chips having a same processing integrated circuit and a same hardware layout, and wherein a first front side bond pad of the first plurality of front side bond pads on the base chip is bonded to a first front side bond pad of the second plurality of front side bond pads on the first chip of the plurality of interchangeable chips, and a third front side bond pad of the third plurality of front side bond pads on the second chip of the plurality of interchangeable chips is bonded to a first backside bond pad of the first plurality of backside bond pads of the first chip of the plurality of interchangeable chips, wherein the first chip of the plurality of interchangeable chips includes metal bond pads at a surface directly bonded to the base chip, at least some of the metal bond pads not being electrically connected to an integrated circuit of the base chip.

8. A method of forming different multi-chip devices, the method comprising:
   performing front side processing for a first base chip on a first wafer, the first base chip having a first plurality of front side bond pads;
   performing front side processing for a second base chip having a second plurality of front side bond pads, the second base chip disposed on a second wafer, the first base chip having a different hardware architecture from the second base chip;
   performing front side processing for a first active chip having a third plurality of front side bond pads and a plurality of backside bond pads on each of third wafers, each of the first active chips of the third wafers having a same processing integrated circuit having a same hardware architecture;
   forming a first multi-chip device comprising bonding the first wafer to a first wafer of the third wafers, the first base chip being directly bonded and electrically connected to the first active chip of the first wafer of the third wafers, wherein a first front side bond pad of the first plurality of front side bond pads on the first base chip is bonded to a first front side bond pad, or is bonded to a first backside bond pad, of the third plurality of front side bond pads, on the first active chip of each of the third wafers; and
   forming a second multi-chip device different from the first multi-chip device, forming the second multi-chip device comprising bonding the second wafer to a second one of the third wafers, the second base chip being directly bonded and electrically connected to the first active chip of the second one of the third wafers, and wherein a first front side bond pad of the first plurality of front side bond pads on the second base chip is bonded to a first front side bond pad, or is bonded to a first backside bond pad, of the third plurality of front side bond pads, on the first active chip of each of the third wafers, wherein the first active chip includes metal bond pads at a surface directly bonded to the first base chip, at least some of the metal bond pads not being electrically connected to an integrated circuit of the first base chip.

9. The method of claim 8 further comprising:
   performing front side processing for a second active chip on each of one or more fourth wafers, the second active chip of the one or more fourth wafers having a processing integrated circuit different from the processing integrated circuit of each of the first active chips; and
   wherein forming the first multi-chip device comprises bonding the first wafer of the third wafers to a first wafer of the one or more fourth wafers, the first active chip of the first wafer of the third wafers being directly bonded and electrically connected to the second active chip of the first wafer of the one or more fourth wafers.

10. The method of claim 9, wherein forming the second multi-chip device comprises bonding the second one of the third wafers to a second one of the one or more fourth wafers, the first active chip of the second one of the third wafers being directly bonded and electrically connected to the second active chip of the second one of the one or more fourth wafers.

11. The method of claim 8, wherein forming the first multi-chip device further comprising bonding the first wafer of the third wafers to a third one of the third wafers, the first active chip of the first wafer of the third wafers being directly bonded and electrically connected to the first active chip of the third one of the third wafers.

12. The method of claim 11 further comprising:
   performing front side processing for a second active chip on a fourth wafer, the second active chip of the fourth wafer having a processing integrated circuit different from the processing integrated circuit of each of the first active chips; and
   wherein forming the second multi-chip device comprises bonding the second one of the third wafers to the fourth wafer, the first active chip of the second one of the third wafers being directly bonded and electrically connected to the second active chip of the fourth wafer.

13. The method of claim 11, wherein forming the second multi-chip device further comprising bonding the second one of the third wafers to a fourth one of the third wafers, the first active chip of the second one of the third wafers being directly bonded and electrically connected to the first active chip of the fourth one of the third wafers.

14. The method of claim 11 further comprising:
   performing front side processing for a second active chip on each of one or more fourth wafers, the second active chip of the one or more fourth wafers having a processing integrated circuit different from the processing integrated circuit of each of the first active chips; and
   wherein forming the first multi-chip device comprises bonding the third one of the third wafers to a first wafer of the one or more fourth wafers, the first active chip of the third one of the third wafers being directly bonded and electrically connected to the second active chip of the first wafer of the one or more fourth wafers.

15. The method of claim 14, wherein forming the second multi-chip device comprises bonding the second one of the third wafers to a second one of the one or more fourth wafers, the first active chip of the second one of the third wafers being directly bonded and electrically connected to the second active chip of the second one of the one or more fourth wafers.

16. The method of claim 14, wherein forming the second multi-chip device further comprises bonding the second one of the third wafers to a fourth one of the third wafers, the first active chip of the second one of the third wafers being directly bonded and electrically connected to the first active chip of the fourth one of the third wafers.

17. The method of claim 16, wherein forming the second multi-chip device further comprises bonding the fourth one of the third wafers to a second one of the one or more fourth wafers, the first active chip of the fourth one of the third wafers being directly bonded and electrically connected to the second active chip of the second one of the one or more fourth wafers.

\* \* \* \* \*